United States Patent
De Brabander et al.

(10) Patent No.: US 9,159,899 B2
(45) Date of Patent: Oct. 13, 2015

(54) FORMING A MEMBRANE HAVING CURVED FEATURES

(71) Applicant: FUJIFILM Corporation, Tokyo (JP)

(72) Inventors: Gregory De Brabander, San Jose, CA (US); Mark Nepomnishy, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 177 days.

(21) Appl. No.: 13/892,489

(22) Filed: May 13, 2013

(65) Prior Publication Data

US 2013/0264911 A1    Oct. 10, 2013

Related U.S. Application Data

(62) Division of application No. 13/086,021, filed on Apr. 13, 2011, now Pat. No. 8,450,213.

(51) Int. Cl.
*H01L 41/053* (2006.01)
*B41J 2/14* (2006.01)
(Continued)

(52) U.S. Cl.
CPC ........... *H01L 41/053* (2013.01); *B41J 2/14209* (2013.01); *B41J 2/14233* (2013.01); *B41J 2/161* (2013.01); *B41J 2/1609* (2013.01); *B41J 2/1629* (2013.01); *B41J 2/1632* (2013.01);
(Continued)

(58) Field of Classification Search
CPC .... H02N 2/001; H02N 2/0055; H01L 41/053; B41J 2/14201; B41J 2/14209; B41J 2/14233; B41J 2002/14266
USPC .................................................. 310/324, 328
See application file for complete search history.

(56) References Cited

U.S. PATENT DOCUMENTS

| 4,322,877 A | 4/1982 | Taylor |
| 5,870,482 A | 2/1999 | Loeppert et al. |
| 5,888,412 A | 3/1999 | Sooriakumar et al. |

(Continued)

FOREIGN PATENT DOCUMENTS

| JP | 2003/291346 | 10/2003 |
| JP | 2009/029012 | 2/2009 |
| JP | 2009/160841 | 7/2009 |

OTHER PUBLICATIONS

"KOH Etching of Silicon wafers, Silicon Dioxide (SiO2) and Silicon Nitride (SiN)," downloaded from the internet on Dec. 16, 2010 at http://cleanroom.byu.edu/KOH.phtml.
(Continued)

*Primary Examiner* — Derek Rosenau
(74) *Attorney, Agent, or Firm* — Fish & Richardson P.C.

(57) ABSTRACT

Processes for making a membrane having a curved feature are disclosed. Recesses each in the shape of a reversed, truncated pyramid are formed in a planar substrate surface by KOH etching through a mask. An oxide layer is formed over the substrate surface. The oxide layer can be stripped leaving rounded corners between different facets of the recesses in the substrate surface, and the substrate surface can be used as a profile-transferring substrate surface for making a membrane having concave curved features. Alternatively, a handle layer is attached to the oxide layer and the substrate is removed until the backside of the oxide layer becomes exposed. The exposed backside of the oxide layer includes curved portions protruding away from the handle layer, and can provide a profile-transferring substrate surface for making a membrane having convex curved features.

9 Claims, 6 Drawing Sheets

(51) Int. Cl.
*B41J 2/16* (2006.01)
*H01L 29/06* (2006.01)

(52) U.S. Cl.
CPC .............. *B41J 2/1642* (2013.01); *B41J 2/1646* (2013.01); *H01L 29/06* (2013.01); *B41J 2002/14266* (2013.01)

(56) References Cited

U.S. PATENT DOCUMENTS

| | | | |
|---|---|---|---|
| 6,019,458 A | 2/2000 | Shimada et al. | |
| 6,168,906 B1 | 1/2001 | Bernstein et al. | |
| 6,396,196 B1 * | 5/2002 | Takeuchi et al. | 310/324 |
| 6,937,736 B2 | 8/2005 | Toda | |
| 7,018,015 B2 | 3/2006 | Truninger et al. | |
| 7,204,586 B2 | 4/2007 | Hoisington et al. | |
| 7,378,030 B2 | 5/2008 | Truninger et al. | |
| 7,502,482 B2 | 3/2009 | Dehe et al. | |
| 7,749,868 B2 | 7/2010 | Honda et al. | |
| 2003/0176043 A1 | 9/2003 | Kim et al. | |
| 2006/0208610 A1 * | 9/2006 | Heim | 310/311 |
| 2007/0026632 A1 | 2/2007 | Yamamoto | |
| 2008/0020573 A1 | 1/2008 | Birkmeyer et al. | |
| 2009/0116675 A1 | 5/2009 | Miyoshi | |
| 2010/0079523 A1 | 4/2010 | Bibl et al. | |
| 2011/0069124 A1 * | 3/2011 | Asaoka et al. | 347/71 |

OTHER PUBLICATIONS

Japanese Office Action issued in JP No. 2012-091160, (partial English Translation), Sep. 22, 2014, 4 pages.
Japanese Office Action (with partial English translation) issued in JP Application No. 2012-091160, mailed Apr. 24, 2015 (4 pages).

* cited by examiner

FORMING A MEMBRANE HAVING CURVED FEATURES

CLAIM OF PRIORITY

This application is a divisional and claims priority to U.S. patent application Ser. No. 13/086,021, filed Apr. 13, 2011, which is incorporated herein by reference in its entirety.

TECHNICAL FIELD

This specification relates to fabrication of MEMS devices.

BACKGROUND

Many MEMS devices include piezoelectric actuators that deflect under applied electric voltages. Examples of such devices include fluid ejection systems that eject fluid in response to the actuation of a piezoelectric actuator connected to a fluid path. A printhead module in an ink jet printer is an example of a fluid ejection system. A printhead module typically has a line or an array of nozzles with a corresponding array of ink paths and associated actuators, and drop ejection from each nozzle can be independently controlled by one or more controllers.

A printhead module can include a semiconductor printhead die that is etched to define a fluid path that includes a pumping chamber. A piezoelectric actuator can be formed on one side of the pumping chamber and, in operation, can flex in response to a driving voltage signal to drive fluid along the ink path. The piezoelectric actuator includes a layer of piezoelectric material that changes geometry (i.e., actuates) in response to the driving voltage applied across the piezoelectric layer by a pair of opposing electrodes.

A piezoelectric element that is curved, such as a dome-shaped or dent-shaped piezoelectric membrane, can produce a larger displacement under a given driving voltage as compared to a flat piezoelectric element of similar lateral dimensions. Since the magnitude of the piezoelectric displacement affects the driving voltage that is required to eject fluid droplets of a desired drop volume, and hence, affects the power efficiency of the printhead module, piezoelectric actuators having curved piezoelectric membranes have been proposed. Various fabrication methods have been proposed to produce piezoelectric membranes that are curved or have curved features.

SUMMARY

This specification describes technologies related to MEMS fabrication processes for producing membranes having curved features.

When a thin layer of material is uniformly deposited on a profile-transferring substrate surface, the layer of material assumes shapes that conform to the profile of the profile-transferring substrate surface.

To prepare the profile-transferring substrate surface for making a membrane having a concave feature, first, a flat-bottomed recess (i.e., a recess in the shape of an inverted, truncated pyramid) is formed in a planar top surface of a semiconductor substrate by anisotropic etching through a patterned mask. Then, the top surface of the semiconductor substrate is oxidized to form an oxide layer that covers both the inside of the recess and the planar substrate surface surrounding the recess. The oxidation process rounds the abrupt corners within the recess. The oxide layer can then be stripped leaving rounded intersections between the bottom and the slanted sidewalls of the recess, and between adjacent sidewalls of the recess. After the oxide layer is stripped, the substrate surface can be used as the profile-transferring substrate surface for making membranes having a concave feature (e.g., a dent) formed therein.

Alternatively, to prepare the profile-transferring substrate surface for making a membrane having a convex feature, after the top surface of the semiconductor substrate is oxidized to form the oxide layer that covers both the inside of the recess and the planar substrate surface surrounding the recess, a handle layer can be attached to the top surface of the oxide layer (in contact with only the planar portion of the oxide layer). The curved portions of the oxide layer protrude away from the handle layer and form domes relative to the handle layer. Then, the semiconductor substrate can be removed (e.g., by etching) until the back side of the oxide layer (i.e., the side of the oxide layer adjacent to the substrate) are exposed. The exposed back side of the oxide layer can be used as the profile-transferring substrate surface for making membranes having convex features (i.e., domes) formed therein.

In one aspect, a process for forming a membrane having a curved feature includes the actions of: oxidizing a top surface of a semiconductor substrate to form an oxide layer, the top surface of the semiconductor substrate having a recess formed therein, the recess having a flat end wall and multiple flat, slanted sidewalls adjacent to the side wall, the oxide layer including a first portion on the end wall of the recess, a second portion on the slanted sidewalls of the recess, and a third portion on the top surface of the semiconductor substrate around an opening of the recess in the top surface of the semiconductor substrate; and stripping the oxide layer to leave respective rounded intersections between the end wall and each slanted sidewall of the recess and between adjacent sidewalls of the recess.

In some implementations, the process further include: after the stripping, depositing a layer of a first material on the top surface of the semiconductor substrate, the layer of the first material covering at least the end wall and the multiple slanted sidewalls of the recess and the respective rounded intersections; and removing at least a portion of the semiconductor substrate from a bottom surface of the semiconductor substrate to expose a bottom surface of the layer of the first material in at least areas previously covering the end wall of the recess and a lower portion of each sidewall adjacent to the end wall.

In some implementations, the process further include: etching the recess in the top surface of the semiconductor substrate through a mask using an anisotropic etchant.

In some implementations, the process further include: prior to the etching, forming the mask on the top surface of semiconductor substrate, the mask having an opening through which the top surface of the semiconductor substrate is exposed, and the opening in the mask having multiple straight edges.

In some implementations, the opening in the mask is of a rectangular shape.

In some implementations, the anisotropic etchant is KOH.

In another aspect, a process for forming a membrane having a curved feature include the actions of: oxidizing a top surface of a semiconductor substrate to form an oxide layer, the top surface of the semiconductor substrate having a recess formed therein, the recess having a flat end wall and multiple flat, slanted sidewalls adjacent to the end wall, the oxide layer including a first portion on the end wall of the recess, a second portion on the slanted sidewalls of the recess, and a third portion on the top surface of the semiconductor substrate around an opening of the recess in the top surface of the semiconductor substrate; bonding a handle layer to a first side of the oxide layer, the handle layer in contact with the third portion of the oxide layer; and removing at least part of the semiconductor substrate to expose a second side of the oxide layer opposite to the first side, in areas of the first portion and at least part of the second portion adjacent to the first portion of the oxide layer.

In some implementations, the process further include: depositing a layer of a first material on the second side the oxide layer over at least the first portion and the at least part of the second portion of the oxide layer.

In some implementations, the process further include: after depositing the layer of the first material, removing at least part of the handle layer to re-expose the first side of the oxide layer in at least the first portion and the second portion of the oxide layer.

In some implementations, the process further include: after removing at least the part of the handle layer, removing at least the first portion and the at least part of the second portion of the oxide layer to expose a portion of the layer of the first material previously deposited on the removed portions of the oxide layer.

In some implementations, the process further include: etching the recess in the top surface of the semiconductor substrate through a mask using an anisotropic etchant.

In some implementations, the process further include: prior to the etching, forming a mask on the top surface of semiconductor substrate, the mask having an opening through which the top surface of the semiconductor substrate is exposed, and the opening in the mask having multiple straight edges.

In some implementations, the opening in the mask is of a rectangular shape.

In some implementations, the anisotropic etchant is KOH.

In another aspect, an apparatus includes a base wafer; and a membrane attached to a top surface of the base wafer, where the membrane is a continuous layer and includes a planar portion and a curved portion protruding from the planar portion, the curved portion includes a flat, end wall parallel to the top surface of the base wafer and multiple flat, slanted sidewalls adjacent to the end wall, and respective intersections between the end wall and each of the slanted sidewalls and respective intersections between each pair of adjacent sidewalls are rounded.

In some implementations, the curved portion protrudes away from the base wafer.

In some implementations, the base wafer includes an aperture and the curved portion protrudes into the aperture in the base wafer.

In some implementations, the membrane is a silicon oxide membrane.

In some implementations, a height of the curved portion is between 5-10 microns.

In some implementations, a lateral dimension of the curve portion is between 100-200 microns.

In some implementations, a thickness of the membrane is between 1-3 microns.

In some implementations, the apparatus further includes: a piezoelectric actuation assembly formed over a top surface of the membrane, the piezoelectric actuation assembly including a curved portion that conforms to a profile of the curved portion of the membrane.

In some implementations, the piezoelectric actuation assembly including a conductive reference electrode layer, a conductive drive electrode layer, and a sputtered piezoelectric layer between the reference electrode layer and the drive electrode layer.

In some implementations, the membrane is of substantially uniform thickness.

In some implementations, at least part of the curved portion is thinner than the planar portion of the membrane.

Particular implementations of the subject matter described in this specification can be implemented to realize one or more of the following advantages.

A profile-transferring substrate surface having curved features can be formed via a series of standard MEMS fabrication processes. The sizes, shapes, and locations of the curved features formed in the profile-transferring substrate surface are uniform and controllable. By using the profile-transferring substrate surface produced according to the methods disclosed in this specification, membranes of various materials can be formed over the profile-transferring substrate surface, where each membrane also assumes curved features conforming to those existing in the profile-transferring substrate surface.

The grain structures of a membrane formed by material deposition over the profile-transferring substrate surface, such as a piezoelectric membrane deposited by sputtering, can be more uniform in size and distribution and be more uniformly aligned than those achievable by injection molding or mechanical means. The more uniform and aligned grain structures can help improve the lifetime of the membrane during repeated actuations.

Curved piezoelectric actuators and transducers can be formed of membranes (e.g., piezoelectric membrane and conductive membranes) having curved features. When the curved features have rounded and smooth transitions between different flat portions of the curved features, the corresponding piezoelectric actuators and transducers can be more durable and can better withstand the stress induced during the operations of the actuators and transducers.

The processes described in this specification can be used to form a durable, highly efficient, compact, and high resolution integrated piezoelectric actuator assembly or piezoelectric transducer array that include curved piezoelectric elements.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 1A-1D followed by FIGS. 1E-1G illustrate the example process for making a membrane having concave features (e.g., dents). FIGS. 1A-1D followed by FIGS. 1H-1M illustrate the example process for making a membrane having convex features (e.g., domes).

Many of the layers and features are exaggerated to better show the process steps and results. Like reference numbers and designations in the various drawings indicate like elements.

DETAILED DESCRIPTION

Figure 1A:
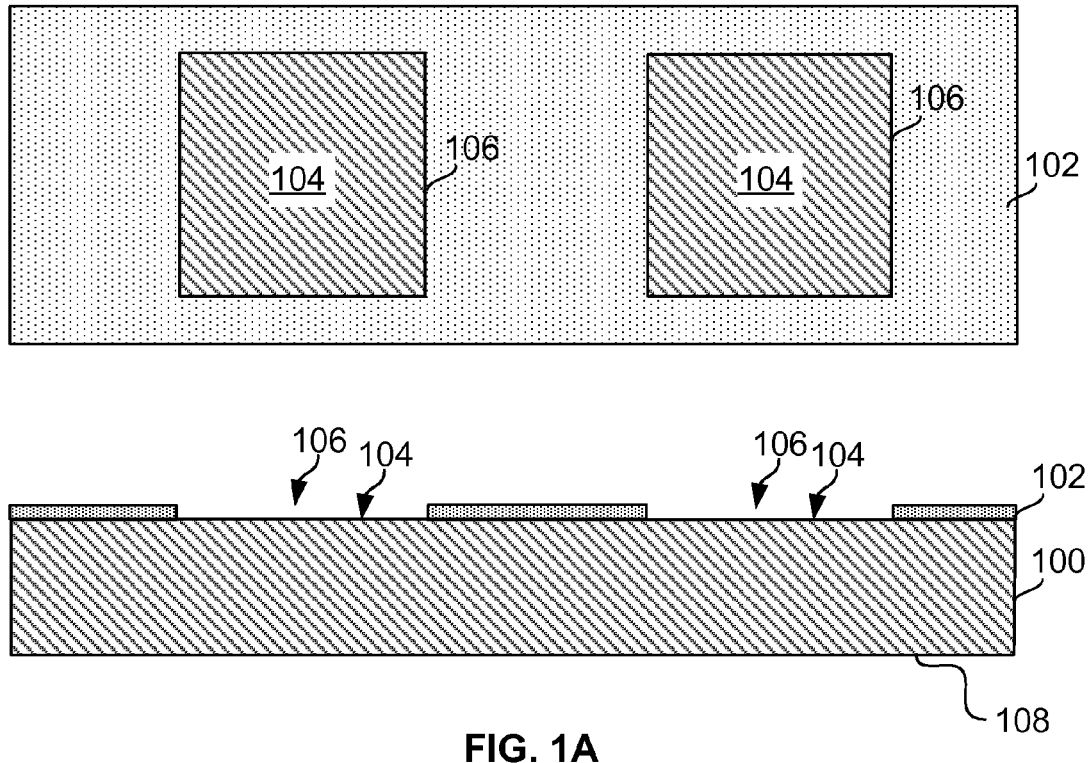
FIGS. 1A-1M illustrate two example processes for forming a membrane having curved features.

Fluid droplet ejection can be implemented with a printhead module which includes a die fabricated using MEMS processing techniques. The printhead die includes a substrate in which a plurality of microfabricated fluid flow paths are formed, and a plurality of actuators on the substrate to cause fluid to be selectively ejected from nozzles connected to the flow paths. Each flow path with its associated actuator provides an individually controllable MEMS fluid ejector unit and the plurality of actuators form an actuator assembly.

A MEMS actuator having a curved piezoelectric membrane can be formed using a profile-transferring substrate having a curved surface feature (e.g., a dent or a dome in a planar substrate surface). Accordingly, an actuator assembly having an actuator array can be formed using a profile-transferring substrate having an array of curved surface features (e.g., an array of dents or domes in a planar substrate surface). The piezoelectric material used for the piezoelectric actuator is deposited (e.g., sputtered) over at least the curved portions of the profile-transferring substrate surface before the profile-transferring substrate is removed from below the curved portions of the piezoelectric membrane.

Without being limited to any particular theories, the resulting curved piezoelectric membrane can include grain structures that are columnar and aligned in both the curved portions and any planar portions surrounding the curved portions, and all or substantially all of the columnar grains are locally perpendicular to the surface of the piezoelectric membrane. Such aligned grain structures have less internal stress during actuation and can be more durable than curved piezoelectric membranes formed by grinding a bulk piezoelectric material or by injection molding.

Different processes may be used to form curved features on a profile transferring substrate surface. As described in this specification, an oxide layer is formed within and around an inverted, truncated pyramidal recess etched in a semiconductor substrate surface. The top surface of the oxide layer (including the curved portions protruding into the substrate) can be used to provide a profile-transferring substrate surface having concave surface features (e.g., dents). Alternatively, the oxide layer can be stripped, and the semiconductor substrate surface below the stripped oxide layer can be used to provide a profile-transferring substrate surface having concave surface features (e.g., dents). Alternatively, the oxide layer is not stripped, instead, a handle layer can be attached to the top surface of the oxide layer, and the substrate can be removed to expose the back side of the oxide layer. The exposed backside of the oxide layer (including the curved portions protruding away from the handle layer) can be used to provide the profile-transferring substrate surface having convex surface features (e.g., domes).

When a thin layer of material is uniformly deposited on the profile-transferring substrate surface, the thin layer of material adopts shapes that conform to the profile of the profile-transferring substrate surface. Thus, the thin layer of material forms a membrane that has curved features conforming to the curved surface features of the profile-transferring substrate surface.

The substrate or handle layer can be subsequently etched from under at least the curved portions of the membrane, leaving the curved features of the membrane suspended and free to deflect. The first thin layer of material that is deposited over the profile-transferring substrate surface can be a bottom electrode layer of a piezoelectric actuator assembly. Additional layers of materials (e.g., the piezoelectric layer and the top electrode layer) can be sequentially deposited over the first thin layer of material, each adopting curved surface features conforming to the curved features of the layer immediately below.

FIGS. 1A-1M illustrate two example processes for forming a membrane having curved features. FIGS. 1A-1D followed by FIGS. 1E-1G illustrate the example process for making a membrane having concave features (e.g., dents). FIGS. 1A-1D followed by FIGS. 1H-1M illustrate the example process for making a membrane having convex features (e.g., domes).

In FIG. 1A, a mask 102 (e.g., a patterned silicon oxide mask, or a patterned silicon nitride mask) is placed or formed on the top surface 104 of a planar substrate 100 (e.g., a semiconductor substrate such as a silicon wafer). The planar substrate 100 also includes a planar bottom surface 108 opposite the top surface 104. The mask 102 includes one or more openings 106 or an array of openings 106. Each opening 106 can be of a polygonal shape (e.g., a square or rectangle) with straight edges. The polygonal shape of the opening 106 allows flat-walled (e.g., vertical or slanted) recesses to be formed in the substrate surface 104 using anisotropic etching (e.g., KOH etching).

In some implementations, the shape of the opening 106 is chosen based on the crystal lattice structures of the substrate 100 to form recesses with flat, slanted sidewalls converging onto a flat, horizontal end wall. In addition, the etchant used in the anisotropic etching has different selectivity for different crystal planes of the substrate 100, and the geometries of the recesses to be formed in the substrate surface 104 can be controlled by the orientation-dependent selectivity of the etchant. Factors that affect the orientation-dependent selectivity of the etchant include the composition and concentration of the etchant and the temperature of the etching environment, for example.

In one example, for a silicon substrate with a <100> surface orientation, to form a recess in the shape of an inverted, truncated pyramid, the opening 106 is square or rectangular. The etchant (e.g., a KOH solution) used in the anisotropic etching has different selectivity for the different crystal planes of the substrate (e.g., etch rate for {110}>etch rate for {100}>>etch rate for {111}). The resulting recess formed in the substrate surface can have flat sidewalls and a flat end wall, and the geometry of the recess is an inverted, truncated pyramid with a square or rectangular base. For example, the sidewalls of the recess can be formed in the <111> crystal planes of the silicon substrate, while the end wall of the recess can be formed in a <100> crystal plane.

The sizes, locations, and overall distribution of the openings 106 in the mask 102 can be chosen based on the desired sizes, locations, and overall distribution of the curved surface features on the profile-transferring substrate surface to be made, and ultimately, of the curved features on the layers of membranes to be formed using the profile-transferring substrate surface. Adjustments to the lateral dimensions of the openings 106 can be made to accommodate the variations created due to the thickness of the different layers (e.g., the oxide layer) that is to be deposited over the recesses.

For example, for making a profile-transferring substrate with dents in its surface, the size of the opening 106 can be made slightly smaller than the desired size of the dents to compensate for the subsequent growth and removal of the oxide layer on the inside of the recesses. Alternatively, if the oxide layer is not stripped and is to be used to provide the profile-transferring substrate surface with dents formed therein, the size of the opening 106 can be made slightly larger than the desired size of the dents to compensate for the growth of the oxide layer on the inside the recesses. Alternatively, if the oxide layer is to be used to provide a profile-transferring substrate with domes formed therein, the size of the opening 106 can be made slightly smaller than the desired size of the domes to compensate for the growth of the oxide layer on the inside of the recesses.

Figure 1B:
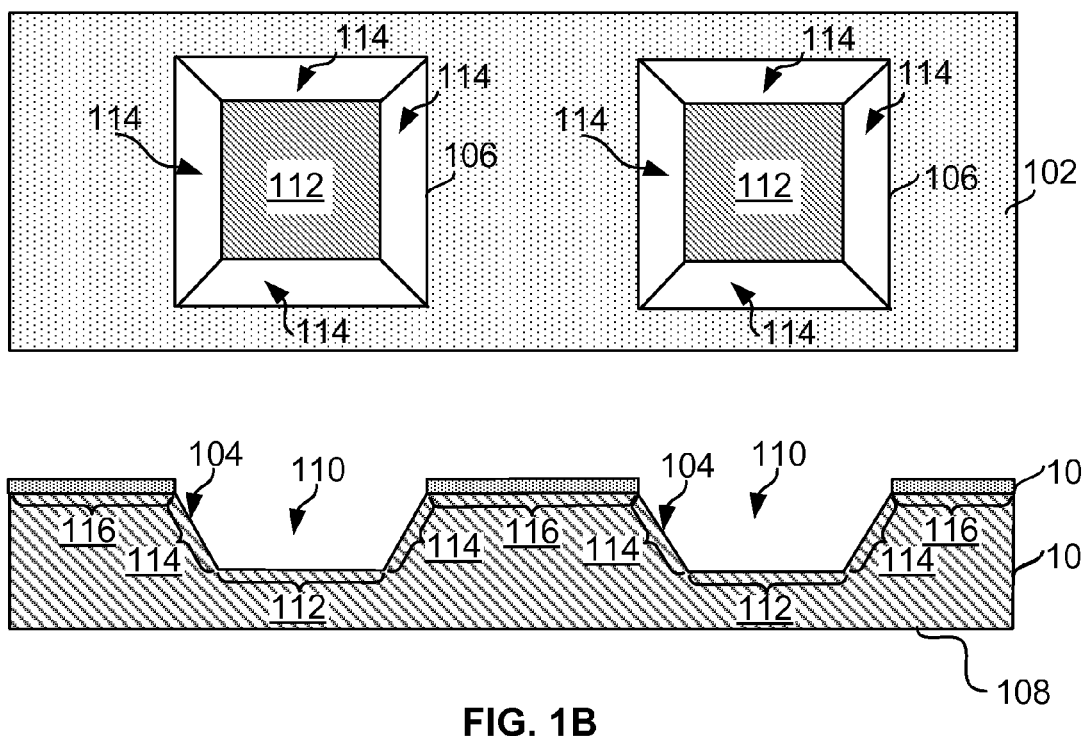

In FIG. 1B, the mask-covered substrate 100 is exposed to the anisotropic etching (e.g., immersed in a KOH solution with selected concentration at a selected temperature) through the openings 106 of the mask 102, and one or more recesses 110 have been formed in the top surface 104 of the substrate 100 at the locations of the openings 106.

Each recess 110 includes a flat end wall 112 and four flat sidewalls 114. The sidewalls 114 are each slanted at an angle relative to a plane parallel to the end wall 112. The four sidewalls 114 of each recess 110 converge toward the end wall 112 of the recess 110 and are each joined to the end wall 112 at a respective edge of the end wall 112. Each pair of adjacent sidewalls 114 of each recess 110 are also joined at a respective edge of the recess 110. The top surface 104 of the substrate 100 now includes curved portions recessed into the body of the substrate 100 (i.e., the portions formed by the sidewalls 114 and end walls 112 of the recesses 110) and planar portions 116 surrounding the curved portions.

In some implementations, the anisotropic etching can be stopped when a predetermined depth of the recess 110 (i.e., as measured by the distance between the plane containing the opening of the recess 110 and the plane containing the end wall 112 of the recess 110) has been reached. In some implementations, the etch rate can be calibrated in terms of time and etch depth, and the anisotropic etching can be stopped after a time period corresponding to a desired depth of the recess 110 has expired. In some implementations, an silicon-on-insulator (SOI) wafer can be used as the substrate 100, and the oxide layer in the SOI wafer can serve as an etch stop when etching the recess 110. When an SOI wafer is used, the silicon layer of the SOI wafer can be thinned (e.g., by polishing) to a thickness equal to the desired depth of the recess 110 before the etching is started.

Figure 1C:
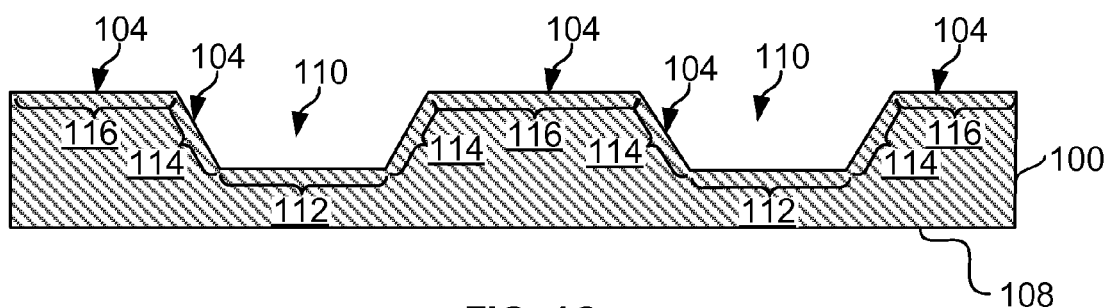

After the desired depth of the recess 110 has been reached, the etching can be stopped, and the mask 102 can be removed (e.g., by etching or polishing) from the top surface 104 of the substrate 100. FIG. 1C shows the substrate 100 after the recesses 110 have been formed in the top surface 104 of the substrate 100. At this point, the respective intersections between the end wall 112 and each sidewall 114 of each recess 110, and the respective intersections between each pair of adjacent sidewalls 114 of each recess 110, and the respective intersections between each sidewall 114 and the planar portion 116 of the top surface 104, are all abrupt transitions (as opposed to round or smooth transitions).

In some implementations, if abrupt transitions between different portions of a curved feature are acceptable in a membrane to be formed, the top surface 104 as shown in FIG. 1C can be used as a profile-transferring substrate surface as is. However, in many applications, it is desirable to have curved features that do not contain abrupt transitions between its different facets. Smoother and rounded transitions between different facets of a curved feature in a membrane can potentially reduce the likelihood of breakage during use, and improve the lifetime of the MEMS devices containing the membrane.

Figure 1D:
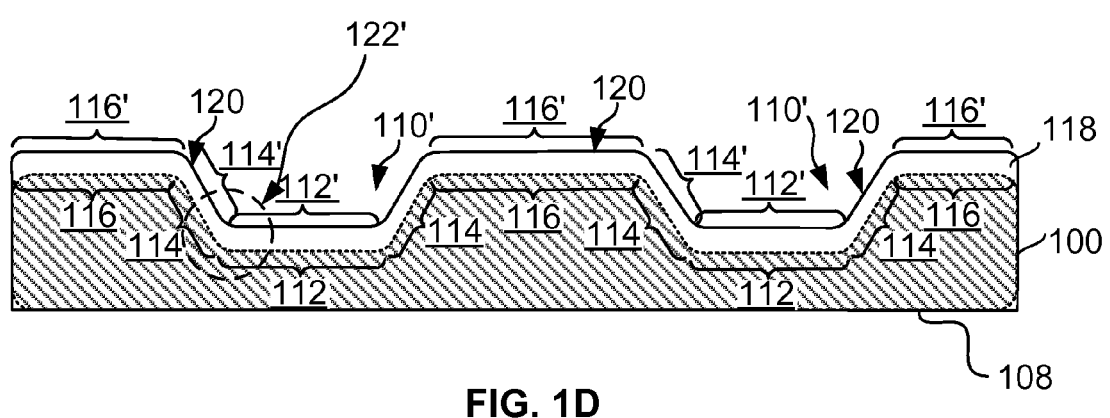
Figure 1E:
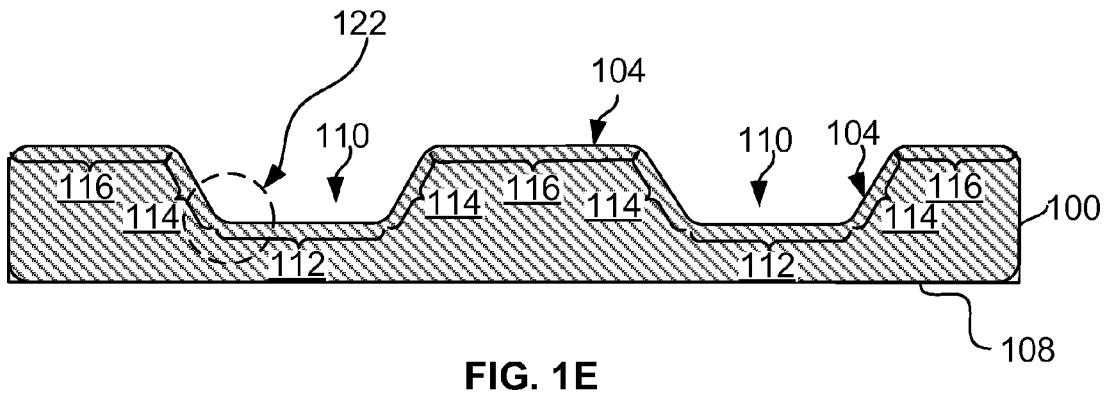
Figure 1F:
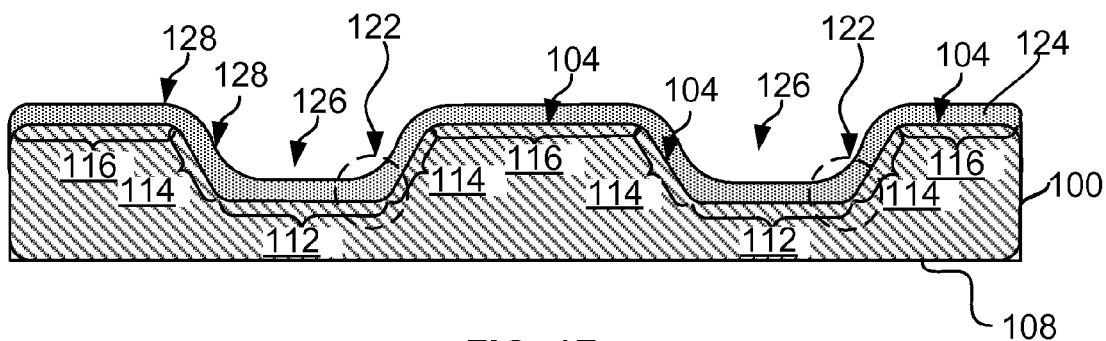
Figure 1G:
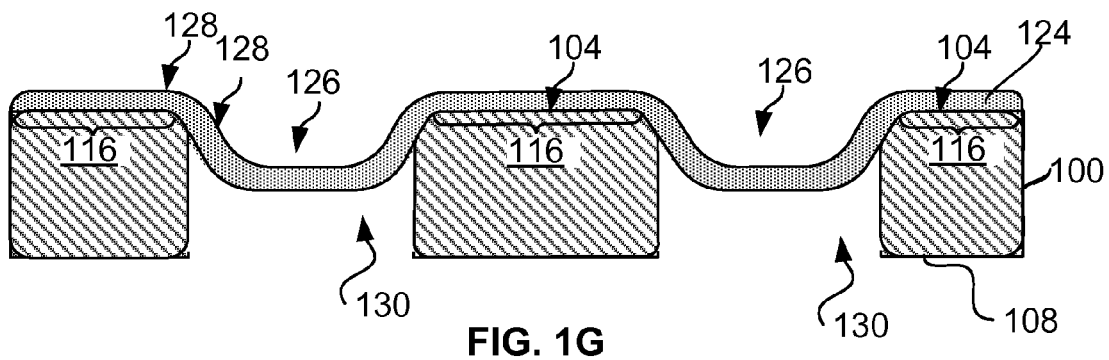

To form a profile-transferring substrate surface with curved features having rounded corners (i.e., smooth and rounded transitions between intersections of adjacent facets of each curved feature), an oxide layer 118 can be formed over the top surface 104 of the substrate 100, both inside the recesses 110 on the sidewalls 114 and end walls 112 of the recesses 110, and on the planar portion 116 of the top surface 104, as shown in FIG. 1D. In some implementations, the oxide layer 118 can be grown on the top surface 104 of the substrate 100 by exposing the top surface 104 to an oxidizing environment (e.g., an oxygen rich, high temperature environment). The growth of the oxide layer 118 (e.g., infusion of oxygen into the surface of the substrate 100) changes the surface profile of the top surface 104 of the substrate 100, and causes the abrupt corners (e.g., the corners at the intersections between different facets of each recess 110) existing in the top surface 104 to become smooth and rounded.

As shown in FIG. 1D, an oxide layer 118 has been formed over the top surface 104 of the substrate 100. The oxide layer 118 include protruding portions 110' inside the recesses 110 and a planar portion 116' on the planar portion 116 of the top surface 104 of the substrate 100. Each protruding or curved portion 110' of the oxide layer 118 includes sidewall portions 114' on the sidewalls 114 of a corresponding recess 110, and an end wall portion 112' on the end wall 112 of the corresponding recess 110.

Within each curved portion 110' of the oxide layer 118, the respective intersection 122' between each sidewall portion 114' and the adjacent end wall portion 112' is rounded. In addition, the respective intersection between each pair of adjacent sidewall portions 114' in the curved portion 110' is also rounded. The respective intersections between the planar portion 116' and the curved portion 110' of the oxide layer 118 are also rounded.

In some implementations, the top surface 120 of the oxide layer 118 (including both the planar portions 116' and the curved portions 110' protruding into the recesses 110) can be used as a profile-transferring substrate surface for making a membrane with dents formed therein. The thickness of the oxide layer 118 can be between a few microns (e.g., 1-3 microns). The depth of the curved portion 110' of the oxide layer 118 can be between 5-10 microns, while the lateral dimensions of the opening of the curved portion 110' can be a few hundred microns (e.g., 100-200 microns).

In some implementations, the oxide layer 118 can be stripped from the top surface 104 of the substrate 100. For example, the oxide layer 118 can be stripped by immersing the structure shown in FIG. 1D in an oxide stripping solution (e.g., a Dilute Hydrofluoric Acid (DHF) solution) briefly. As shown in FIG. 1E, after the oxide stripping, the top surface 104 of the substrate 100 is exposed, and the top surface profile of the substrate 100 exhibits rounded corners at the intersections 122 between the sidewalls 114 and the end wall 112 of each recess 110, at the intersections between the adjacent sidewalls 114 of the recess 110, and at the intersections between the planar portion 116 and the sidewalls 114 of the recess 110. After the oxide stripping, the outer surface 104 of the substrate 100 can be used as a profile-transferring substrate surface for making a membrane having dents formed therein, where the intersections between different facets of each recess 110 are rounded and smooth.

As shown in FIG. 1F, a thin layer of material 124 is deposited on the exposed top surface 104 of the substrate 100 after the oxide stripping. In some implementations, the thin layer of material 124 can be a layer of conductive material (e.g., a few thousands of Angstroms of Au, Au/W, Ir, Pt, and so on). The layer of material 124 is of uniform thickness and can serve as a bottom electrode layer of a piezoelectric actuator assembly. The layer of conductive material 124 includes a planar portion on the planar portion 116 of the top surface 104, and protruding or curved portions 126 over the recesses 110 in the top surface 104. Thus, the thin layer of material 124 is a membrane including planar portions and curved portions 126 protruding into the body of the substrate 100. In some implementations, after the oxide layer 118 is stripped, another layer of oxide can be formed (e.g., grown or deposited) on the exposed top surface 104 of the substrate 100, and the newly formed layer of oxide is a membrane including planar portions and curved portions 126 protruding into the body of the substrate 100. The newly formed oxide layer can be thinner than the oxide layer 118, such that the intersections between the different portions of the newly formed oxide layer remain smooth and rounded at the completion of the growth or deposition of the new oxide layer.

The respective intersections between the planar portion and the curved portions 126 of the membrane 124 conform to the rounded intersections between the planar portion 116 and the recesses 110 in the top surface 104, and are also smooth and rounded. In addition, the respective intersections between the sidewalls and the end wall of each curved portion 126 and the respective intersections between adjacent sidewalls of each curved portion 126 are also smooth and rounded, as are the corresponding intersections in the recesses 110 of the substrate 100.

Additional layers of materials (not shown in FIG. 1F) can be deposited over the top surface 128 of the first layer of material 124, such as a piezoelectric layer, and a top electrode layer. Various suitable methods for depositing the one or more layers of materials can be used. For example, the bottom electrode layer, the piezoelectric layer, and the top electrode layer can each be deposited by sputtering, plasma-enhanced vapor deposition, chemical vapor deposition, or physical vapor deposition, and so on. The different layers of materials can each be patterned before the next layer of material is deposited over it. The different layers can form the piezoelectric actuator assembly of a fluid ejection module or other MEMS devices.

In some implementations, the substrate 100 or at least a portion of it can be removed from the backside (i.e., from the back surface 108 of the substrate 100) to expose the curved portions 126 of the membrane 124. For example, the substrate material is removed (e.g., by etching) from areas of the bottom surface 108 of the substrate 100 that are directly below the curved portions 126 of the membrane 124. A cavity can be formed in the substrate 100 on the bottom side of the substrate 100. The etching can continue within the cavity until the bottom surface of the membrane 124 becomes exposed.

As shown in FIG. 1G, in some implementations, an area of the substrate 100 is etched away to form a cavity 130. The lateral dimensions of the cavity 130 can be smaller than the lateral dimensions of the entire curved portions 126 of the membrane 124, thus, only the lower portions of the curved portions 126 (e.g., including the end wall and the lower ¾ of the sidewalls of the curved portions 126) are exposed within the cavity 130, leaving the upper portions of the curved portion 126 embedded within the substrate 100, as shown in FIG. 1G.

In some implementations, the cavity 130 can have larger lateral dimensions, and the entire curved portions 126 (e.g., including the end wall and all of the sidewalls) of the membrane 124 can be exposed by etching within the cavity 130. In some implementations, the lateral dimensions of the cavity 130 can be made even larger, exposing the entire curved portions 126 of the membrane 124 and part of the planar portions of the membrane 124 surrounding the curved portions 126.

Although not shown in FIGS. 1E-1G, in some implementations, after the oxide layer 118 is stripped following the step shown in FIG. 1D, a new layer of oxide can be formed (e.g., deposited or grown) on the exposed substrate surface 104. The newly formed oxide layer (not shown) can be used as the profile-transferring substrate surface for forming the membrane 124, when the cavities 130 are created (e.g., by etching) in the back side 108 of the substrate 100, the backside of the newly formed oxide layer is exposed first. In some implementations, the etching can be stopped after the backside of the newly formed oxide layer is exposed, and the exposed back surface of the oxide layer 118 can serve as an etch stop for the etching process. Alternatively, the etching can continue to thin the oxide layer 118 to a desired thickness within the walls of the cavity 130. By reducing the thickness of the newly formed oxide layer, the membrane 124 (e.g., a bottom electrode layer) and any additional layers (e.g., the piezoelectric layer and the top electrode layer) formed above the membrane 124 can have better compliance and deform more freely under pressure or other actuating forces (e.g., driving voltages). The thinned, newly formed oxide layer can protect the membrane 124 from being eroded or contaminated by other materials (e.g., ink) that would fill the cavity 130 in an actual MEMS device (e.g., a printhead). In some implementations, the thickness of the newly formed oxide layer is chosen to be thinner than the oxide layer 118, such that the newly formed oxide layer is sufficiently flexible and has sufficiently smooth and rounded transitions between its different portions. In some implementations, the etching of the oxide layer 118 can continue until the back surface of the membrane layer 124 becomes exposed within the cavities 130. In such implementations, the newly formed oxide layer is completely removed from the areas within the walls of the cavities 130 in the bottom side 108 of the substrate 100, but portions of the oxide layer 118 remain at least between the planar portions of the substrate 100 and the planar portions of the membrane 124.

Figure 2A:
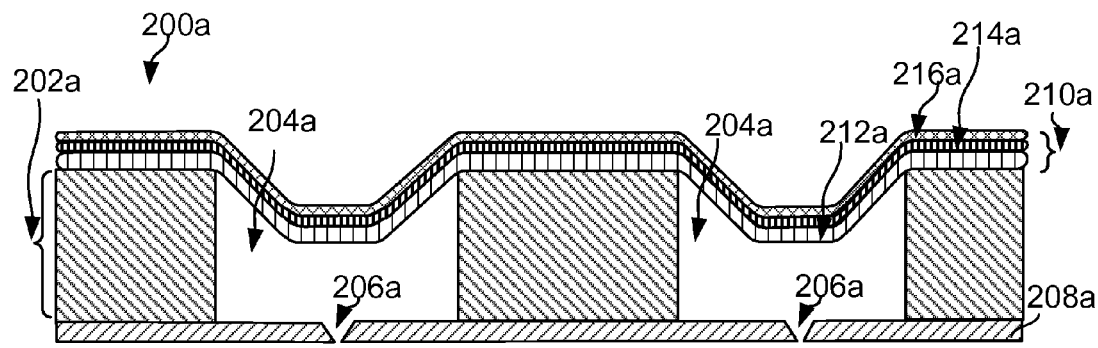
FIG. 2A is a schematic cross-sectional view of a printhead die in an example fluid ejection module having a concave piezoelectric actuator.

The process described with respect to FIGS. 1A-1G and the resulting structure shown in FIG. 1G can be used to form an example fluid ejection system 200a shown in FIG. 2A. More detail on the example fluid ejection 200a shown in FIG. 2A will be provided later in the specification.

FIGS. 1A-1D followed by FIGS. 1H-1M illustrate an example process for making a profile-transferring substrate surface having convex surface features (e.g., domes) formed therein, and making a membrane having convex features using the profile-transferring substrate surface.

To make the profile-transferring substrate surface having domes formed therein, a recess is first formed in the planar top surface 104 of the substrate 100, and an oxide layer 118 is formed on the top surface 104 of the substrate 100, according to the process described above with respect to FIGS. 1A-1D. The oxide layer 118 has a planar portion 116' above the planar portion 116 of the substrate surface 104, and curved portions 110' (i.e., portions formed by the sidewall portions 114' and the adjacent end wall portion 112' of the oxide layer 118) over the sidewalls 114 and the end wall 112 of the recesses 110. The curved portions 110' of the oxide layer 118 protrude into the body of the substrate 100. Since the oxide layer 118 is a layer of uniform thickness, when another substrate (e.g., a handle layer) is attached to the top surface 120 the oxide layer 118, and the entire structure is flipped over, the concave curved portions 110' of the oxide layer 118 will become convex curved portions relative to the body of the new substrate.

Figure 1H:
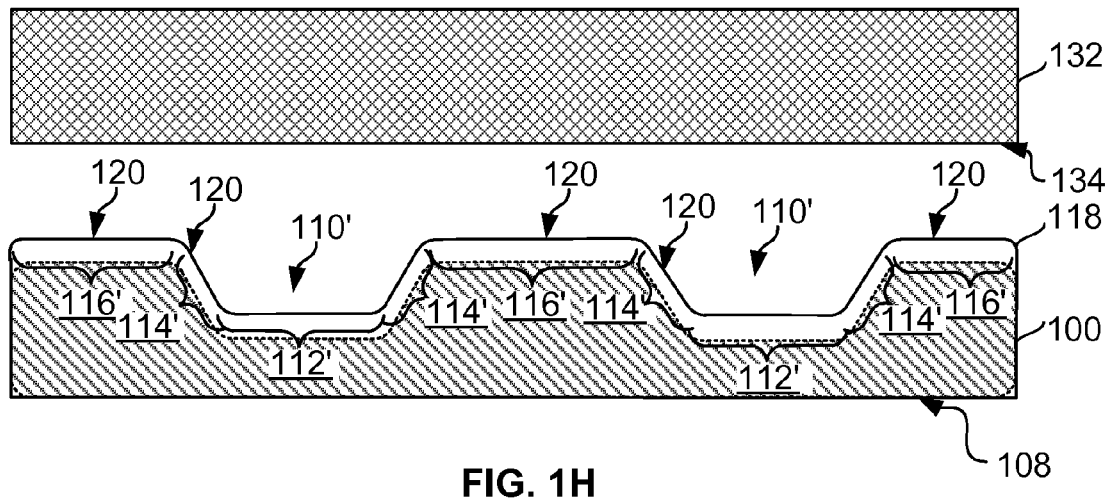

As shown in FIG. 1H, a planar handle layer 132 (e.g., another silicon substrate) is placed over the top surface 120 of the oxide layer 118 shown in FIG. 1D. The handle layer 132 can be a few hundred microns thick (e.g., 150-600 microns). In some implementations, before the planar bottom surface 134 of the handle layer 132 makes contact with the top surface 120 of the oxide layer 118, the bottom surface 134 of the handle layer 132 and the top surface 120 of the oxide layer 118 can be prepared (e.g., cleaned and polished) for bonding.

Figure 1I:
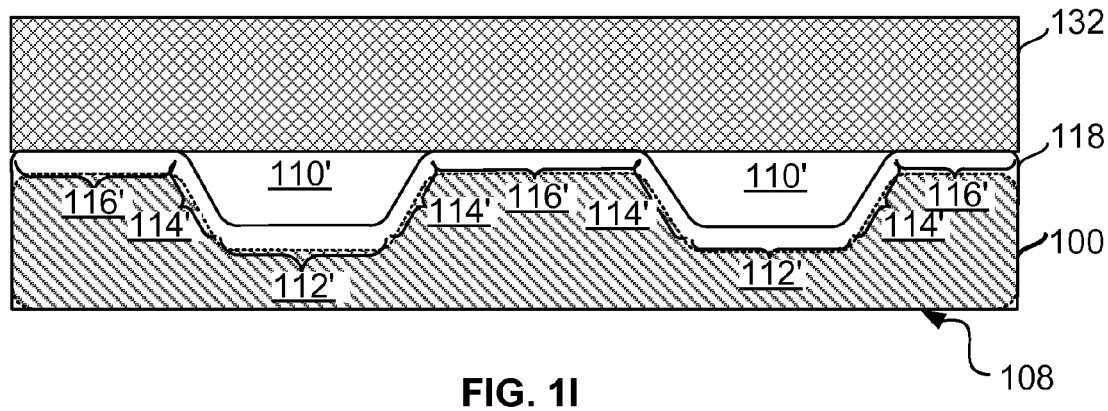

As shown in FIG. 1I, when the bottom surface 134 of the handle layer 132 and the top surface 120 of the oxide layer 118 are pressed together, only the planar portion 116' of the oxide layer 118 make contact with the planar bottom surface 134 of the handle layer 132. In some implementations, the handle layer 132 and the oxide layer 118 are annealed, such that the temporary bond between the bottom surface 134 of the handle layer 132 and the top surface 120 of the oxide layer 118 becomes a permanent bond, and the openings of the curved portions 110' become sealed by the bottom surface 134 of the handle layer 132.

When the structure shown in FIG. 1I is flipped over, the curved portions 110' of the oxide layer 118 become convex features relative to the handle layer 132. The substrate 100 can be removed (e.g., by grinding and etching) from the bottom side 108 to expose the embedded back surface of the oxide layer 118. The exposed back surface of the oxide layer 118 will include curved portions protruding away from the handle layer surrounded by the planar portion of the oxide layer 118.

Figure 1J:
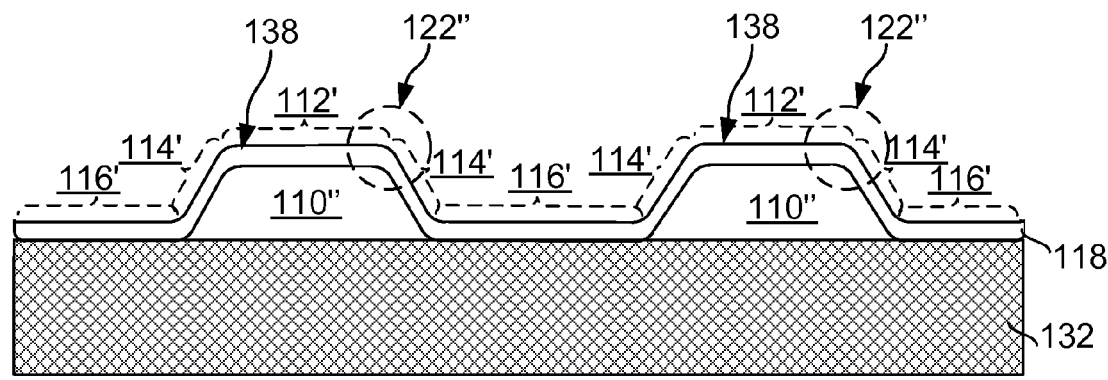

FIG. 1J shows that the substrate 100 has been removed (e.g., by grinding and etching) such that the oxide layer 118 that previously covers the recesses 110 in the substrate 100 now become exposed from the backside. The previously embedded lower surface of the oxide layer 118 is now the exposed outer surface 138 of the oxide layer 118. The exposed oxide layer 118 includes the planar portion 116' and curved portions 110" protruding away from the handle layer 132. The protruding or curved portions 110" include a flat end wall 112', and slanted sidewalls 114', and are in the shape of a truncated pyramid with a rectangular base. The concave curved portions 110' of the oxide layer 118 now becomes convex curved portions 110" (e.g., oxide dome shells).

In some implementations, when the substrate 100 is removed by etching, the oxide layer 118 can serve as the etch stop during the removal of the substrate 100. The intersections 122" between the end wall 112' and the sidewalls 114' of each oxide dome shell 110", and the intersections between adjacent sidewalls 114' of the oxide dome shell 110" are rounded. The exposed outer surface 138 of the oxide layer 118 can provide the profile-transferring substrate surface having convex surface features (e.g., domes) formed therein.

Figure 1K:
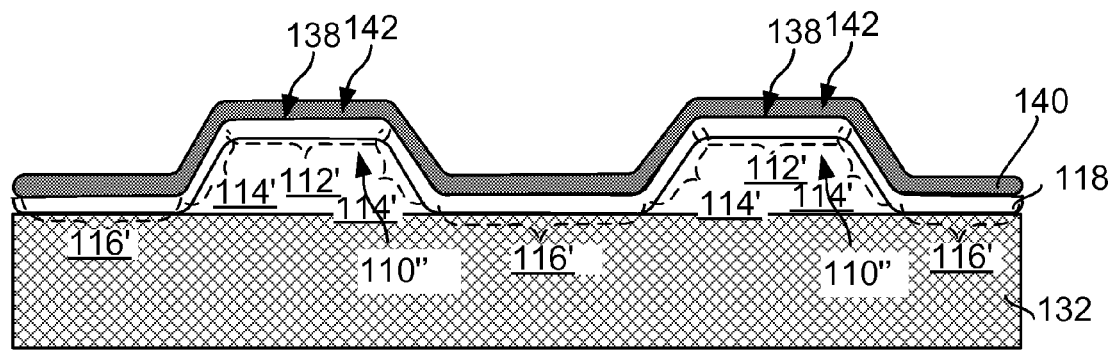

As shown in FIG. 1K, a thin layer of material 140 is deposited on the exposed outer surface 138 of the oxide layer 118 (e.g., over at least the areas of the oxide dome shells 110"). In some implementations, the thin layer of material 140 can be a layer of conductive material (e.g., a few thousands of Angstroms of Au, Au/W, Ir, Pt, and so on). The layer of material 140 is of uniform thickness and can serve as a bottom electrode layer of a piezoelectric actuator assembly. The layer of conductive material 140 includes a planar portion on the planar portion 116' of the oxide layer 118, and curved portions 142 on the curved portions 110" of the oxide layer 118. Thus, the thin layer of material 140 is a membrane including a planar portion and curved portions 142 protruding away from the body of the handle layer 132.

The intersections between the planar portion and the curved portions 142 of the membrane 140 conforms to the rounded intersections between the planar portion 116' and the curved portions 110" of the oxide layer 118, and are also smooth and rounded. In addition, the respective intersections between the sidewalls and the end wall of each curved portion 142 and the respective intersections between adjacent sidewalls of each curved portion 142 of the membrane 140 are also smooth and rounded, as are the corresponding intersections in the curved portion 110" of the oxide layer 118.

Additional layers of materials (not shown in FIG. 1K) can be deposited over the top surface of the first layer of material 140, such as a piezoelectric layer, and a top electrode layer. Various suitable methods for depositing the one or more layers of materials can be used. For example, the bottom electrode layer, the piezoelectric layer, and the top electrode layer can each be deposited by sputtering, plasma-enhanced vapor deposition, chemical vapor deposition, or physical vapor deposition, and so on. The different layers of materials can each be patterned before the next layer of material is deposited over it. The different layers can form the piezoelectric actuator assembly of a fluid ejection module or other MEMS devices.

Figure 1L:
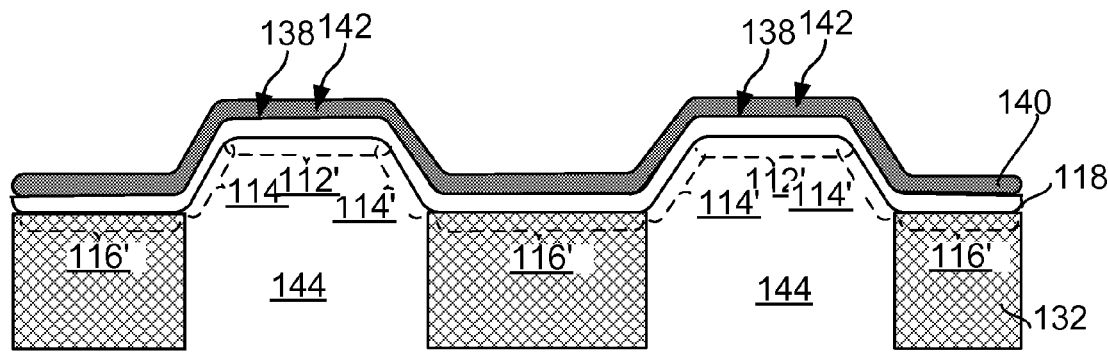

In some implementations, the handle layer 132 or at least a portion of it can be removed from the backside (i.e., from the back surface of the handle layer 132 opposite to the surface 134 shown in FIG. 1H) to expose at least the curved portions 110" of the oxide layer 118 from the back surface (i.e., previously the top surface 120 of the oxide layer 118 shown in FIG. 1I). For example, as shown in FIG. 1L, the handle layer material is removed (e.g., by etching) from areas of the bottom surface of the handle layer 132 that are directly below the curved portions 110" (i.e., the portion 110" formed by the sidewalls 114' and the adjacent end wall 112') of the oxide layer 118. As a result, a cavity 144 can be formed in the handle layer 132 on the bottom side of the handle layer 132. The etching can continue within the cavity 144 until the back surface (i.e., previously the top surface 120) of the oxide layer 118 become re-exposed or opened to atmosphere.

In some implementations, the etching can be continued until the oxide layer 118 is thinned to a desired thickness within the walls of the cavity 144. By reducing the thickness of the oxide layer 118, the membrane 140 (e.g., a bottom electrode layer) and any additional layers (e.g., the piezoelectric layer, and the top electrode layer) formed above the membrane 140 can have better compliance and deform more freely under pressure or other actuating forces (e.g., driving voltages). The thinned oxide layer 118 can protect the membrane 140 from being eroded or contaminated by other materials (e.g., ink) that would fill the cavity 144 in an actual MEMS device (e.g., a printhead).

Figure 1M:
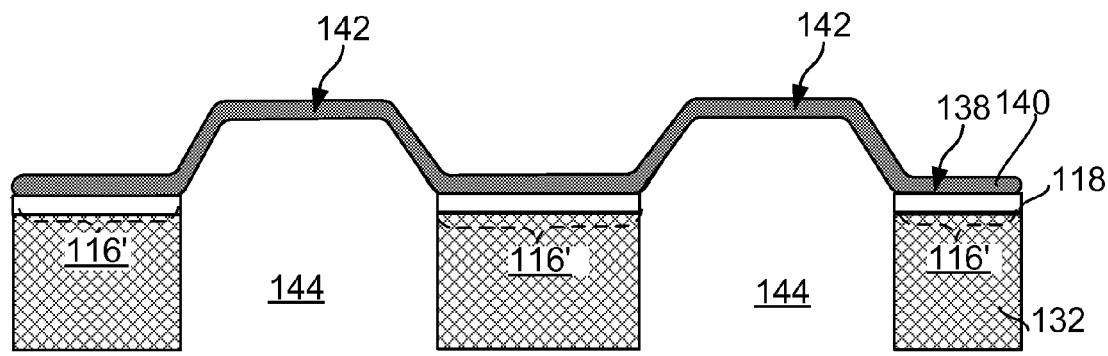

In some implementations, the etching of the oxide layer 118 can be continued until the back surface of the membrane layer 140 becomes exposed within the cavities 144, in other words, until the inner surface of the curved portions 142 in the membrane layer 140 become exposed or opened to atmosphere. As shown in FIG. 1M, the oxide layer 118 has been completely removed from the areas within the sidewalls of the cavities 144 in the bottom side of the handle layer 132. The oxide layer 118 remains between the planar portions of the handle layer 132 and the planar portions of the membrane 140. In some implementations, the cavities 144 can be made larger, and the entire curved portions 142 of the membrane 140 and some planar portion of the membrane 140 surrounding the curved portions 142 can be exposed and suspended within the cavities 144.

Figure 2B:
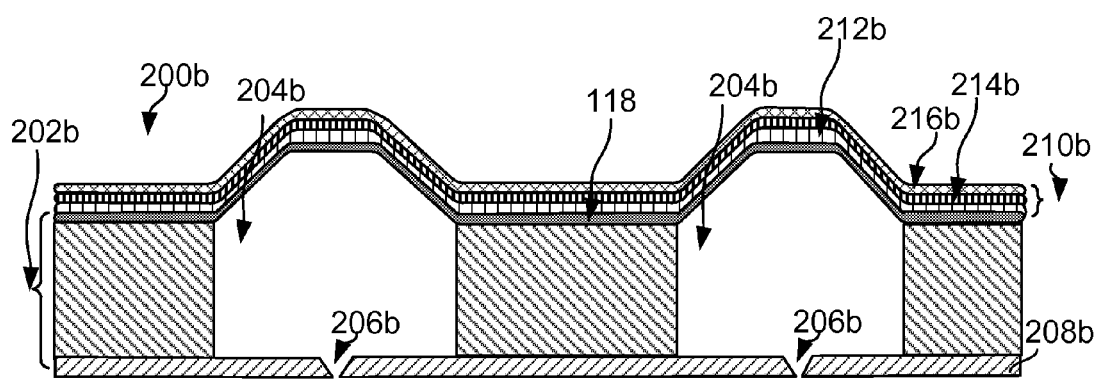
FIG. 2B is a schematic cross-sectional view of a printhead die in an example fluid ejection module having a convex piezoelectric actuator.

The process described with respect to FIGS. 1A-1D followed by FIGS. 1H-1M and the resulting structure shown in FIG. 1M can be used to form an example fluid ejection system 200b shown in FIG. 2B. More detail on the example fluid ejection 200b shown in FIG. 2B will be provided later in the specification.

FIG. 2A is a schematic of an example fluid ejection system 200a that can be formed at least in part using the process shown in FIG. 1A-1G. As shown in FIG. 2A, the substrate 100 having the cavities 130 formed therein can serve as a pumping chamber layer 202a of the fluid ejection system 200a, and the cavities 130 can serve as the pumping chamber cavities 204a for the fluid ejection system 200a. The pumping chamber cavities 204a are connected to fluid paths that have been formed in the pumping chamber layer 202a in a different process. Nozzles 206a are formed in a nozzle layer 208a, and are connected to the pumping chamber cavities 204a. A number of layers that are deposited over the substrate 100 after the oxide layer 118 was stripped can form the piezoelectric actuator assembly 210a above the pumping chamber layer 202a. As shown in FIG. 2A, the layers include a bottom electrode layer 212a, a piezoelectric layer 214a, and a top electrode layer 216a. Each of these three layers can be patterned to define individual actuator units that include a top electrode, a bottom electrode, and piezoelectric element directly above each pumping chamber cavity 204a. Each of these three layers include respective curved portions protruding into the apertures of the pumping chamber cavities 204a, surrounded by a respective planar portion.

Although not shown in FIG. 2A, in some implementations, if the piezoelectric assembly 210a had been formed over an oxide layer deposited or grown on the substrate surface after the oxide layer 118 was stripped, and if the newly formed oxide layer is thinned but not completely removed within the walls of the cavities 130, the newly formed oxide layer can exist in areas within the sidewalls of the pumping chamber cavities 204a with a smaller thickness, but still exists with its original thickness in the planar portions of the pumping chamber layer 202a outside of the pumping chamber cavities 204a. The curved portions of the newly formed oxide layer protrude into the apertures of the pumping chamber cavities 204a, support the curved portions of the layers deposited above the newly formed oxide layer. In some implementations, the newly formed oxide layer can be completely removed from within the sidewalls of the cavities 204a, but exist with its original thickness in the planar portions of the pumping chamber layer 202a. In some implementations, the newly formed oxide layer can maintain its original uniform thickness in all areas, existing below and supporting the actuator assembly 210a.

FIG. 2B is a schematic of an example fluid ejection system 200b that can be formed at least in part using the process shown in FIG. 1A-1D, followed by FIGS. 1H-1M. As shown in FIG. 2B, the oxide layer 118 in conjunction with the handle layer 132 having the cavities 142 formed therein, can serve as a pumping chamber layer 202b of the fluid ejection system 200b, and the cavities 142 can serve as the pumping chamber cavities 204b for the fluid ejection system 200b. The pumping chamber cavities 204b are connected to fluid paths that have been formed in the pumping chamber layer 202b in a different process. Nozzles 206b are formed in a nozzle layer 208b, and are connected to the pumping chamber cavities 204b.

A number of layers that are deposited over the oxide layer 118 can form the piezoelectric actuator assembly 210b above the pumping chamber layer 202b. As shown in FIG. 2B, the layers include a bottom electrode layer 212b, a piezoelectric layer 214b, and a top electrode layer 216b. Each of these three layers can be patterned to define individual actuator units that include a top electrode, a bottom electrode, and piezoelectric element directly above each pumping chamber cavity 204b. In some implementations, the oxide layer 118 has uniform thickness in all areas. In some implementations, the oxide layer 118 has been thinned in areas within the sidewalls of the pumping chamber cavities 204b, but still has its original thickness in portions outside of the pumping chamber cavities 204b. In some implementations, the oxide layer 118 can be completely removed within the sidewalls of the cavities 204b, but still exists with its original thickness in portions outside of the pumping chamber layer 202b.

Although examples are described in terms of a process for making a piezoelectric actuator assembly for a fluid ejection system, the process can be used in making other MEMS devices that include membranes having curved features or arrays of curved features.

The use of terminology such as "front," "back," "top," "bottom," "over," "above," and "below" throughout the specification and claims is to illustrate the relative position or orientation of various components of the system. The use of such terminology does not imply a particular orientation of the structure. Similarly, the use of any horizontal or vertical terms to describe elements is in relation to the implementation described. In other implementations, the same or similar elements can be oriented other than horizontally or vertically as the case may be.

What is claimed is:

1. An apparatus, comprising:
   a base wafer; and
   a membrane attached to a top surface of the base wafer, where the membrane is a continuous layer and includes a planar portion and a curved portion protruding from the planar portion, the curved portion includes a flat, end wall parallel to the top surface of the base wafer and multiple flat, slanted sidewalls adjacent to the end wall, and respective intersections between the end wall and each of the slanted sidewalls and respective intersections between each pair of adjacent sidewalls are rounded, wherein at least part of the curved portion is thinner than the planar portion of the membrane.

2. The apparatus of claim 1, wherein the curved portion protrudes away from the base wafer.

3. The apparatus of claim 1, wherein base wafer includes an aperture and the curved portion protrudes into the aperture in the base wafer.

4. The apparatus of claim 1, wherein the membrane is a silicon oxide membrane.

5. The apparatus of claim 1, wherein a height of the curved portion is between 5-10 microns.

6. The apparatus of claim 1, wherein a lateral dimension of the curved portion is between 100-200 microns.

7. The apparatus of claim 1, wherein a thickness of the membrane is between 1-3 microns.

8. The apparatus of claim 1, further comprising:
   a piezoelectric actuation assembly formed over a top surface of the membrane, the piezoelectric actuation assembly including a curved portion that conforms to a profile of the curved portion of the membrane.

9. The apparatus of claim 8, wherein the piezoelectric actuation assembly includes a conductive reference electrode layer, a conductive drive electrode layer, and a sputtered piezoelectric layer between the reference electrode layer and the drive electrode layer.

* * * * *